United States Patent
Tang et al.

(10) Patent No.: US 8,179,188 B2
(45) Date of Patent: May 15, 2012

(54) METHOD FOR OPERATING SEMICONDUCTOR DEVICE

(75) Inventors: Sung-Nien Tang, Hsinchu County (TW);
Wei-Lun Hsu, Hsin-Chu Hsien (TW);
Ching-Ming Lee, Miaoli County (TW);
Te-Yuan Wu, Hsin-Chu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/282,482

(22) Filed: Oct. 27, 2011

(65) Prior Publication Data

US 2012/0038414 A1     Feb. 16, 2012

Related U.S. Application Data

(62) Division of application No. 12/573,884, filed on Oct. 6, 2009, now Pat. No. 8,072,011.

(51) Int. Cl.
*H03K 17/687* (2006.01)
(52) U.S. Cl. .......................... 327/431; 327/537; 257/335
(58) Field of Classification Search .................. 327/431, 327/537; 257/335
See application file for complete search history.

(56) References Cited

U.S. PATENT DOCUMENTS

| 7,355,224 B2 | 4/2008 | Cai |
| 2007/0041227 A1 | 2/2007 | Hall et al. |

OTHER PUBLICATIONS

Chorng-Wei Liaw, et al., "Pinch-Off Voltage-Adjustable High-Voltage Junction Field-Effect Transistor", IEEE Electron Device Letters, vol. 28, No. 8, Aug. 2007.

*Primary Examiner* — Thien F Tran
(74) *Attorney, Agent, or Firm* — Winston Hsu; Scott Margo

(57) ABSTRACT

A method for operating a semiconductor device including a lateral double diffused metal oxide semiconductor (LDMOS) with a first source, a common drain and a first gate, a junction field effect transistor (JFET) with a second source, the common drain and a second gate wherein the second source is electrically connected to the first gate and an inner circuit electrically connected to the first source is provided. The first source provides the inner circuit with an inner current to generate an inner voltage by means of the lateral double diffused metal oxide semiconductor, and the lateral double diffused metal oxide semiconductor turns off when the inner voltage is elevated substantially as high as the first gate voltage.

8 Claims, 4 Drawing Sheets

METHOD FOR OPERATING SEMICONDUCTOR DEVICE

CROSS REFERENCE TO RELATED APPLICATIONS

This application is a divisional application of and claims the benefit of U.S. patent application Ser. No. 12/573,884, filed Oct. 06, 2009.

BACKGROUND OF THE INVENTION

1. Field of the Invention

The present invention relates to a method for operating a semiconductor device of lateral double diffused metal oxide semiconductor (LDMOS). In particular, the present invention is directed to a method for operating a semiconductor device of lateral double diffused metal oxide semiconductor (LD-MOS) integrated with a junction field effect transistor (JFET). Such semiconductor device may be selectively turned on and turned off in accordance with a predetermined design.

2. Description of the Prior Art

With the coming of the mobile communication era, all kinds of wireless communication devices, such as mobile phones, global positioning systems (GPS), or cell phone base stations, are growing rapidly in recent years, A high voltage device such as the lateral double diffused metal oxide semiconductor (LDMOS) are often designed to be the control circuit of the radio frequency (900 MHz-2.4 GHz) because it not only has high operating bandwidth but also has higher break down voltage and higher output power due to element design and manufacturing process, so it is widely used in the power amplifier of all kinds of wireless communicating systems.

FIG. 1 illustrates a cross section view of a conventional lateral double diffused metal oxide semiconductor. The lateral double diffused metal oxide semiconductor 110 has a gate 111, a source 112, and a drain 113. When the threshold voltage of the lateral double diffused metal oxide semiconductor needs adjusting, another reticle is needed and an ion implantation should be carried out to implant different dopant. It is well known that either amending an old reticle or constructing a new reticle all cost a lot of money. Accordingly, this additional reticle is a heavy cost burden to the manufacturer of the lateral double diffused metal oxide semiconductor.

Second, because the lateral double diffused metal oxide semiconductor is a semiconductor device of depletion mode, the concentration of the dopant in the substrate need controlling to adjust the threshold voltage of the lateral double diffused metal oxide semiconductor. That is, the concentration of the dopant in the region 1 needs adjusting to adjust the threshold voltage of the lateral double diffused metal oxide semiconductor 110. However, if the threshold voltage should be higher, the concentration of the dopant should be higher, too. Obviously, the higher the concentration of the dopant, the lower the electrical resistance of the substrate is so the region 1 is always conductive.

Since the region 1 is always conductive, it leaves the lateral double diffused metal oxide semiconductor always on (a turn-on state), too and makes the lateral double diffused metal oxide semiconductor hard turn off. Therefore, the dilemma is to have a higher threshold voltage and to turn off the lateral double diffused metal oxide semiconductor easily at the same time. Accordingly, a novel lateral double diffused metal oxide semiconductor is needed. On one hand, there is no need of additional reticle or of increase of dopant concentration to adjust the threshold voltage. On the other hand, the lateral double diffused metal oxide semiconductor may selectively turn on and turn off to be an easily-controlled semiconductor device.

SUMMARY OF THE INVENTION

The present invention therefore proposes a novel lateral double diffused metal oxide semiconductor. On one hand, there is no need of additional reticle or of increase of dopant concentration to adjust the threshold voltage of the lateral double diffused metal oxide semiconductor of the present invention. On the other hand, the lateral double diffused metal oxide semiconductor of the present invention may selectively turn on and turn off. The lateral double diffused metal oxide semiconductor of the present invention is as a result an easily-controlled semiconductor device.

The present invention first proposes a semiconductor device. The semiconductor device of the present invention includes a lateral double diffused metal oxide semiconductor, a junction field effect transistor and an inner circuit. The lateral double diffused metal oxide semiconductor includes a first source, a common drain and a first gate. The junction field effect transistor includes a second source, the common drain and a second gate. The second source is electrically connected to the first gate. The inner circuit is electrically connected to the first source.

The present invention also proposes a method for operating a semiconductor device. First, a semiconductor device is provided. The semiconductor device includes a lateral double diffused metal oxide semiconductor, a junction field effect transistor and an inner circuit. The lateral double diffused metal oxide semiconductor includes a first source, a common drain and a first gate. The junction field effect transistor includes a second source, the common drain and a second gate. The second source is electrically connected to the first gate. The inner circuit is electrically connected to the first source. Second, the common drain is electrically connected to a drain voltage so that the second source is charged by the common drain of the junction field effect transistor. Then, the second source is charged to have a first gate voltage and the first gate has the first gate voltage to turn on the lateral double diffused metal oxide semiconductor. In addition, the first source provides the inner circuit with an inner current to generate an inner voltage by means of the lateral double diffused metal oxide semiconductor, so the lateral double diffused metal oxide semiconductor turns off when the inner voltage is elevated substantially as high as the first gate voltage.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
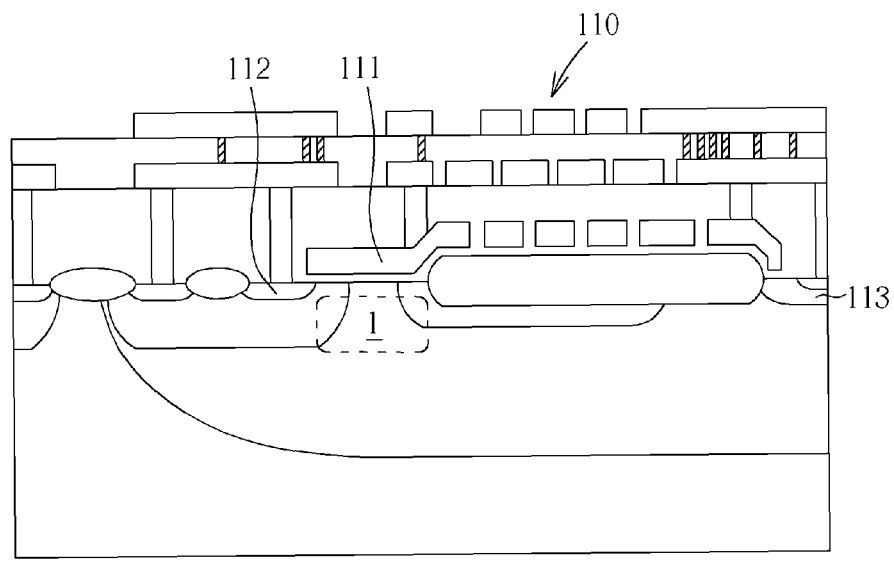
FIG. 1 illustrates a cross section view of a conventional lateral double diffused metal oxide semiconductor.
Figure 2:
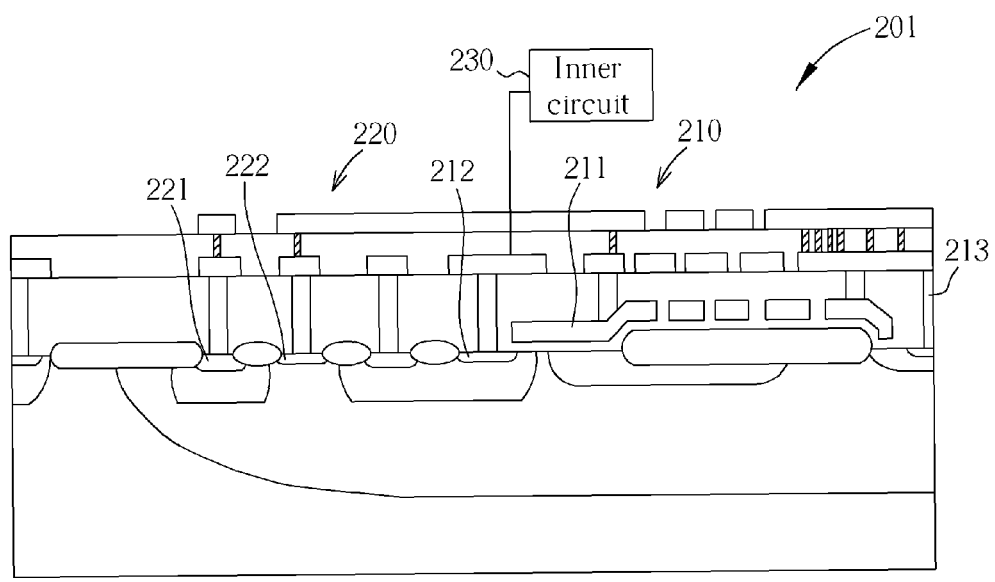
FIG. 2 illustrates a cross-sectional view of the semiconductor device of the present invention.
Figure 3:
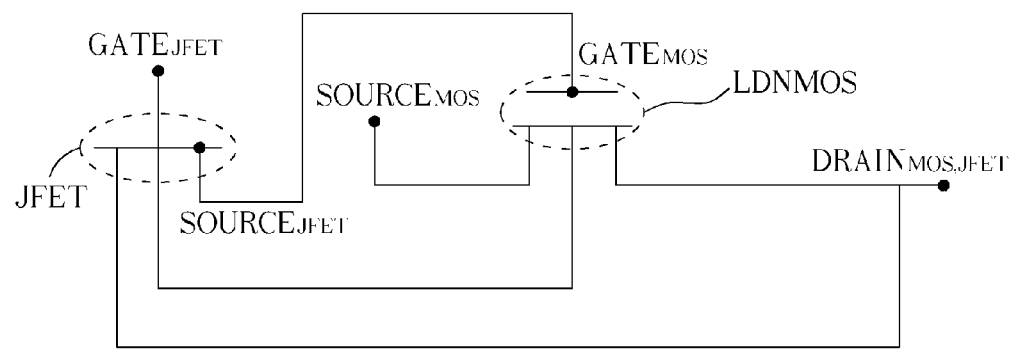
FIG. 3 illustrates an equivalent circuit of the semiconductor device of the present invention.

The present invention first provides a semiconductor device. The semiconductor device of the present invention is characterized in that the lateral double diffused metal oxide semiconductor may be selectively in a turn-on state or a turn-off state. FIG. 2 illustrates a cross-sectional view of the semiconductor device of the present invention. As shown in FIG. 2, the semiconductor device 201 of the present invention includes a lateral double diffused metal oxide semiconductor 210, a junction field effect transistor 220 and an inner circuit 230. The lateral double diffused metal oxide semiconductor 210 is in an enhanced mode, however the junction field effect transistor 220 is in a depletion mode. As known by persons skilled in this art, the lateral double diffused metal oxide semiconductor 210 may include a first gate 211, a first source 212 and a common drain 213. The lateral double diffused metal oxide semiconductor 210 share the common drain 213 with the junction field effect transistor 220. The semiconductor device 201 of the present invention may be used in a driver circuit. FIG. 3 illustrates an equivalent circuit of the semiconductor device of the present invention.

The junction field effect transistor 220 includes a second gate 221, a second source 222 and the common drain 213. Please note that the second source 222 is electrically connected to the first gate 211. This is another feature of the present invention. The semiconductor device 201 of the present invention further includes the inner circuit 230. The inner circuit 230 is electrically connected to the first source 212. The inner circuit 230 may be any suitable circuit, a driver circuit for example, which is electrically connected to the semiconductor device 201 of the present invention. The details will not be described here.

Please note that the present invention adjusts the width of the second source 222 of the junction field effect transistor 220 if the threshold voltage of the lateral double diffused metal oxide semiconductor 210 needs adjusting so that the width of the second source 222 has a dimension of micrometer (μm). For example, the width of the second source 222 of the junction field effect transistor 220 is 7-8 μm. The wider the width of the second source 222 is, the higher the threshold voltage of the lateral double diffused metal oxide semiconductor 210 is.

During the manufacturing process, the width of the second source 222 is determined by the reticle design to construct the second source 222. The width of the second source 222 is designed in accordance the requirements so that the threshold voltage of the lateral double diffused metal oxide semiconductor 210 can be adjusted to be optionally higher or lower. As to the methods for manufacturing the lateral double diffused metal oxide semiconductor and the junction field effect transistor, they are known by persons skilled in the art so the details will not be discussed here.

Figure 4:
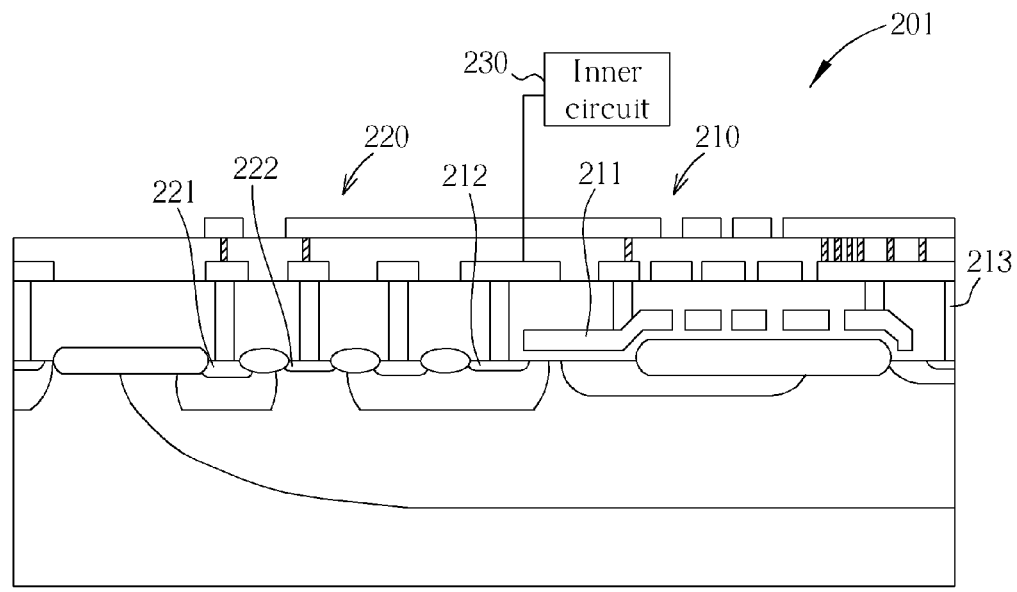
FIGS. 4-6 illustrate a preferred embodiment of the method to operate the semiconductor device of the present invention.
Figure 5:
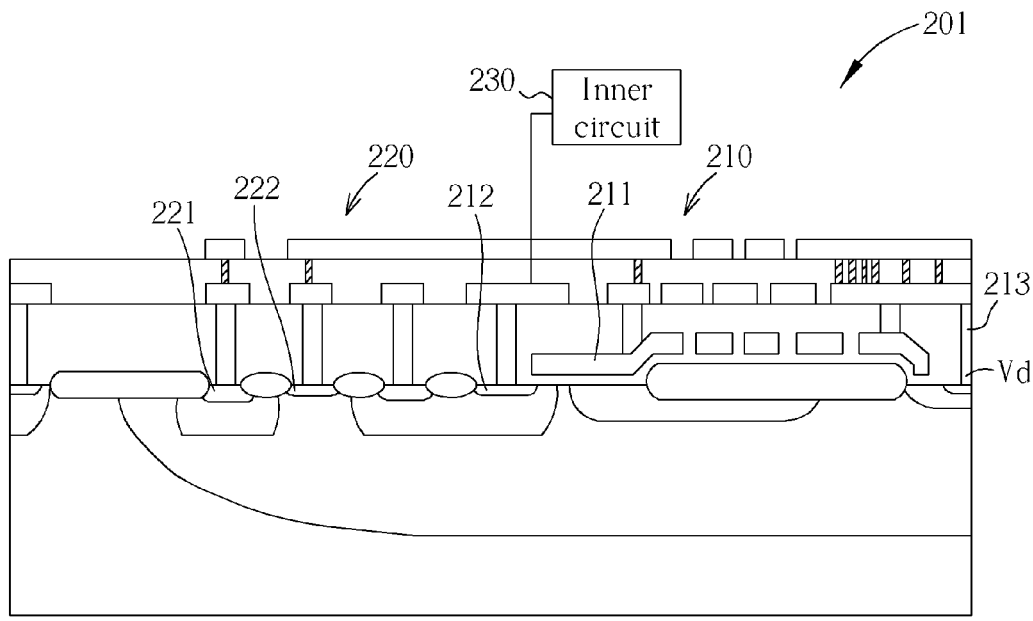
Figure 6:
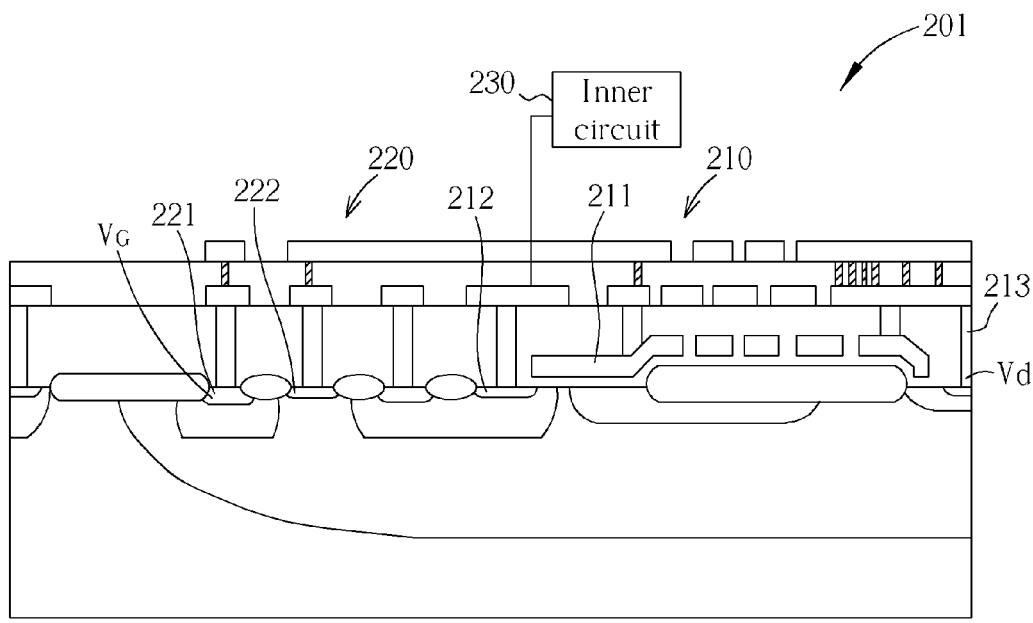

Next, the present invention provides a method for operating the semiconductor device 201. FIGS. 4-6 illustrate a preferred embodiment of the method to operate the semiconductor device of the present invention. In the beginning, as shown in FIG. 4, a semiconductor device 201 is provided. The semiconductor device 201 includes a lateral double diffused metal oxide semiconductor 210, a junction field effect transistor 220 and an inner circuit 230. The lateral double diffused metal oxide semiconductor 210 is in an enhanced mode, but the junction field effect transistor 220 otherwise is in a deple-tion mode. As known by persons skilled in this art, the lateral double diffused metal oxide semiconductor 210 may include a first gate 211, a first source 212 and a common drain 213. The lateral double diffused metal oxide semiconductor 210 share the common drain 213 with the junction field effect transistor 220. The semiconductor device 201 of the present invention may be used in a driver circuit.

The junction field effect transistor 220 includes a second gate 221, a second source 222 and the common drain 213. Please note that the second source 222 is electrically connected to the first gate 211. The semiconductor device 201 of the present invention further includes the inner circuit 230, which is electrically connected to the first source 212. The inner circuit 230 may be any suitable circuit, a driver circuit for example, which is electrically connected to the semiconductor device 201 of the present invention, so the details will not be de scribed here.

Then, as shown in FIG. 5, the common drain 213 is electrically connected to a drain voltage (Vd) so that the second source 222 is charged by the common drain 213 of the junction field effect transistor 220. The drain voltage (Vd) is depending on the operational requirements. For example, the drain voltage (Vd) may be between 0V to 700V. Later, as shown in FIG. 6, the second source 222 is charged to have a first gate voltage and the first gate 211 has the first gate voltage. As a result, the lateral double diffused metal oxide semiconductor 210 turns on automatically. Please note that the first gate 211 now starts to have a first gate voltage because the second source 222 is electrically connected to the first gate 211. As soon as the first gate voltage is high enough, the lateral double diffused metal oxide semiconductor 210 turns on.

On the other hand, because the inner circuit 230 is electrically connected to the first source 212, the first source 212 of the lateral double diffused metal oxide semiconductor 210 which now turns on starts to provide the inner circuit 230 with an inner current and to generate a corresponding inner voltage. As the turn-on state remains, the inner voltage rises gradually. The lateral double diffused metal oxide semiconductor 210 turns off automatically when the inner voltage is elevated substantially as high as the first gate voltage since there is no potential difference between the first gate 211 and the first source 212.

Figure 7:
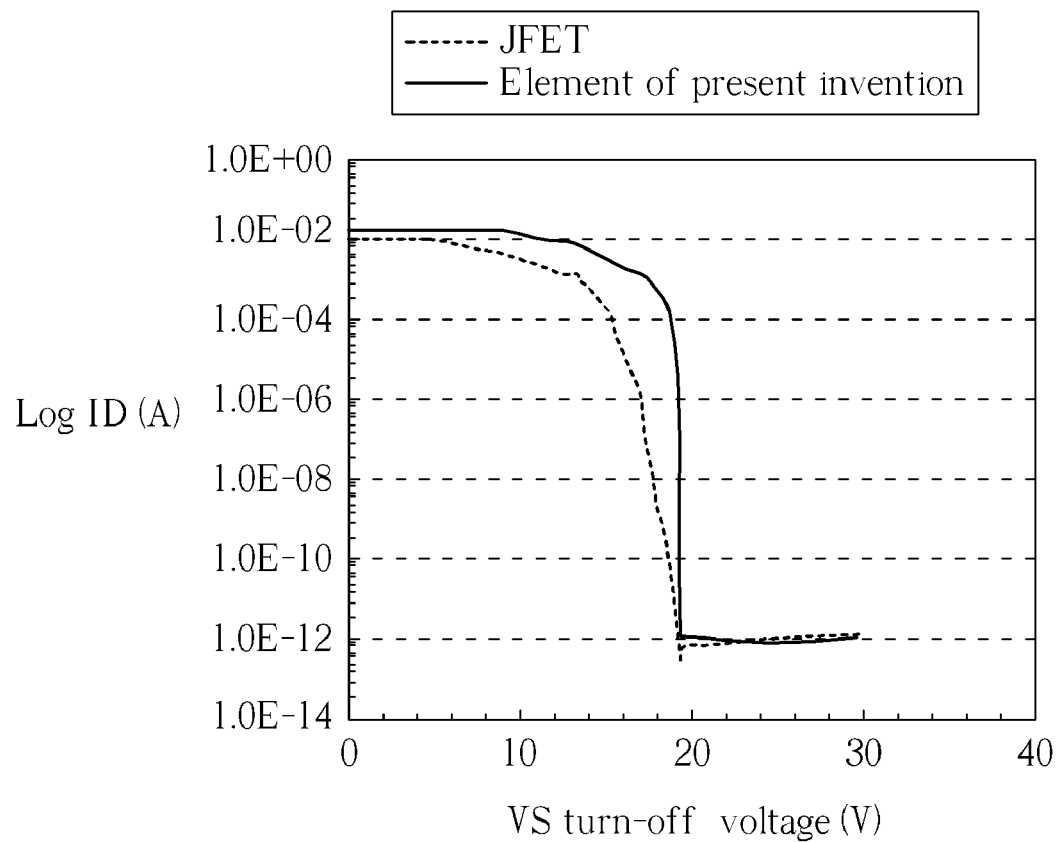
FIG. 7 shows the voltage vs. current of the semiconductor device 201 of the present invention and of a conventional junction field effect transistor.

One of the features of the semiconductor device 201 of the present invention is that the lateral double diffused metal oxide semiconductor 210 is very sensitive. FIG. 7 shows the voltage vs. current of the semiconductor device 201 of the present invention and of a conventional junction field effect transistor. As soon as the inner voltage is elevated substantially as high as the first gate voltage, the lateral double diffused metal oxide semiconductor 210 turns off automatically and instantly (minimal current) but the conventional junction field effect transistor fails to do so. The lateral double diffused metal oxide semiconductor 210 has a quiet sensitive and rapid response to the change of the inner voltage.

After the lateral double diffused metal oxide semiconductor 210 turns off automatically, it turns on automatically again under some certain circumstances. When the inner voltage drops due to some reason, it means the inner voltage is lower than the first gate voltage again because the inner circuit 230 is electrically connected to the first source 212. The lateral double diffused metal oxide semiconductor 210 surely turns on again automatically since the inner voltage now is lower than the first gate voltage. In other words, the lateral double diffused metal oxide semiconductor 210 may be selectively in a turn-on state or a turn-off state in accordance with the change of the inner voltage, i.e. under the influence or the control of the inner circuit 230. This feature readily solves the problem found in the prior art that the lateral double diffused metal oxide semiconductor has difficulty in turning off.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for operating a semiconductor device, comprising:
    providing a semiconductor device, comprising:
        a lateral double diffused metal oxide semiconductor (LDMOS), comprising a first source, a common drain and a first gate;
        a junction field effect transistor (JFET) comprising a second source, said common drain and a second gate, wherein said second source is electrically connected to said first gate; and
        an inner circuit electrically connected to said first source;
    connecting said common drain to a drain voltage; and
    charging said second source by said common drain so that said second source is charged to have a first gate voltage and said first gate has the first gate voltage to turn on said lateral double diffused metal oxide semiconductor, wherein said first source provides said inner circuit with an inner current to generate an inner voltage by means of said lateral double diffused metal oxide semiconductor, and said lateral double diffused metal oxide semiconductor turns off when said inner voltage is elevated substantially as high as said first gate voltage.

2. The method for operating the semiconductor device of claim 1, further comprising:
    lowering said inner voltage so that said lateral double diffused metal oxide semiconductor turns on again when said inner voltage is lower than said first gate voltage.

3. The method for operating the semiconductor device of claim 1, wherein said drain voltage is in a range between 0V-700V.

4. The method for operating the semiconductor device of claim 1, wherein a width of said second source is adjusted to control a threshold voltage of said lateral double diffused metal oxide semiconductor.

5. The method for operating the semiconductor device of claim 4, wherein the width of said second source has a dimension of micrometer (μm).

6. The method for operating the semiconductor device of claim 1, wherein said lateral double diffused metal oxide semiconductor and said junction field effect transistor share said common drain.

7. The method for operating the semiconductor device of claim 1, wherein said lateral double diffused metal oxide semiconductor is in an enhanced mode.

8. The method for operating the semiconductor device of claim 1, wherein said junction field effect transistor is in a depletion mode.

* * * * *